United States Patent

Wang et al.

[11] Patent Number: 5,607,874
[45] Date of Patent: Mar. 4, 1997

[54] METHOD FOR FABRICATING A DRAM CELL WITH A T SHAPED STORAGE CAPACITOR

[75] Inventors: Chen-Jong Wang; Mong-Song Liang, both of Hsin-Chu, Taiwan

[73] Assignee: Taiwan Semiconductor Manufacturing Company, Ltd., Hsin-Chu, Taiwan

[21] Appl. No.: 590,029

[22] Filed: Feb. 2, 1996

[51] Int. Cl.$^6$ .............................. H01L 21/70; H01L 27/00
[52] U.S. Cl. ............................. 437/52; 437/60; 437/919
[58] Field of Search .................................. 437/52, 60, 919

[56] References Cited

U.S. PATENT DOCUMENTS

| | | | |
|---|---|---|---|
| 5,206,183 | 4/1993 | Dennison | 437/52 |
| 5,364,809 | 11/1994 | Kwon et al. | 437/52 |
| 5,389,568 | 2/1995 | Yun | 437/52 |
| 5,399,518 | 3/1995 | Sim et al. | 437/52 |
| 5,429,979 | 7/1995 | Lee et al. | 437/52 |
| 5,451,539 | 9/1995 | Ryou | 437/60 |

*Primary Examiner*—Jey Tsai
*Attorney, Agent, or Firm*—George O. Saile; William J. Stoffel

[57] ABSTRACT

Two embodiments of a method are described for fabricating a DRAM cell having a T or Y shaped capacitor connected to a MOS transistor with source and drain regions. In a first embodiment, the method comprises using two masks to form a cylindrical hole partial through the insulating layer and a concentric contact hole over the source. A first conductive layer is formed over the first insulating layer, at least completely filling the trench and filling the contact hole. In a key step, the first polysilicon layer is chemically mechanically polished thereby forming a T shaped storage electrode. Next, a capacitor dielectric layer and a top electrode are sequentially formed over at least the T shaped storage electrode. The second embodiment form the contact hole and trench as described above. A conformal first conductive layer is formed over the first insulating layer, filling the contact hole and covering the sidewalls and bottom of the trench, but not filling the trench. A dielectric layer is formed over the first conductive layer at least fills the trench. The dielectric layer and the first conductive layer are chemically mechanically polished forming the Y shaped electrode. Next, a capacitor dielectric layer and a top electrode are formed over the Y shaped storage electrode.

8 Claims, 5 Drawing Sheets

METHOD FOR FABRICATING A DRAM CELL WITH A T SHAPED STORAGE CAPACITOR

BACKGROUND OF INVENTION

1) Field of the Invention

This invention relates generally to the fabrication of capacitors in a dynamic random access memory (DRAM) cell and more particularly to a method and process for fabricating capacitors with a large capacitance.

2) Description of the Prior Art

In dynamic semiconductor memory storage devices, it is essential that storage node capacitor cell plates be large enough to retain an adequate voltage level in spite of parasitic capacitances and noise that may be present during circuit operation. As is the case for most semiconductor integrated circuitry, circuit density continues to increase at a fairly constant rate. The issue of maintaining storage node capacitance is particularly important as the density of DRAM cells continues to increase for future generations of memory devices.

Semiconductor manufacturing technologies must develop the capabilities to densely pack storage cells while maintaining the required storage capacitances if future generations of expanded memory array devices are to be successfully manufactured.

The array of storage cells on a dynamic random access memory (DRAM) chip is one such circuit element experiencing electrical limitations. These individual DRAM storage cells, usually consisting of a single metal-oxide-semiconductor field-effect-transistor (MOS-FET) and a single capacitor are used extensively in the electronic industry for storing data. A single DRAM cell stores a bit of data on the capacitor as electrical charge. The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of the memory cell as well as consumes excessive power during low-voltage operation by impeding device operation.

Generally, in a 64 MB DRAM having a 1.5 $\mu m^2$ memory cell area employing an ordinary two dimensional stacked capacitor cell, sufficient cell capacitance cannot be obtained even though a higher capacitor dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and box structured capacitors. In order to increase the surface area of the capacitor, there have also been proposed methods of forming a capacitor with a pin structure extending throughout a multi-layer structure of the capacitor to connect the layers with one another and methods of forming a capacitor using a hemispherical grain polysilicon (HSG) process using polysilicon grains.

One problem with current methods of fabricating capacitors having a non-planar topography is that metal "stingers" form between on polysilicon lines after polysilicon etch back steps. Metal stringers often remain behind at the foot or sides of a steep step when an anisotropic etching is used to pattern the polysilicon or metal layers. These stringers can cause shorting problems and can reduce yields.

Workers in the art are aware of the limitations of capacitors and have attempted to resolve them. U.S. Pat. No. 5,451,539 (Ryou) forms a T shaped storage electrode, but uses a photo-etch process to define the storage electrode. U.S. Pat. No. 5,399,518 (Sim) teaches a method of forming a T-shaped storage electrode by using a photo-etch step. U.S. No. 5,364,809 (Kwon et al.) teaches a method of fabricating a multi-chamber type capacitor. A stacked capacitor having a concave area is formed by coating an insulation layer with polysilicon, filling the central cavity with photo resist and etching back the polysilicon on the of the insulation layer to form a storage electrode. Kwon goes on to form multi-chambers in the capacitor. However, many of the prior art methods require substantially more processing steps or/and planar structures which make the manufacturing process more complex and costly. Therefore, it is very desirable to develop processes that are as simple as possible and maximize the capacitance per unit area. There is a challenge to develop methods of manufacturing these capacitors that minimize the manufacturing costs and maximize the device yields. In particular, there is a challenge to develop a method which minimizes the number of photoresist masking operations and provides maximum process tolerance to maximize product yields.

SUMMARY OF THE INVENTION

It is an object of the present invention to provide a method for fabricating a T or Y shaped capacitor which has less photolithographic and etch steps than the conventional processes.

It is an object of the present invention to provide a method for fabricating a (DRAM) having T or Y shaped capacitor with a high density and capacitance.

It is another object of the present invention to provide a structure for a cylindrical T or Y shaped capacitor with a high density and capacitance which does not have the stinger problem.

It is another object of the present invention to provide a structure for a cylindrical T or Y shaped capacitor which is defined by the contact hole therefore allows tighter ground rules and denser circuitry.

To accomplish the above objectives, the present invention provides two embodiments for a method of manufacturing a cylindrical T or Y shaped capacitor for a dynamic random access memory (DRAM). The first embodiment provides a method of fabricating capacitor having a T shaped storage electrode for a memory device on a substrate. The substrate has a device area with a source region formed therein. The method comprises the steps of: forming an etch barrier layer over the device area and elsewhere over the substrate. A first insulating layer is formed over the barrier layer. The first insulating layer is patterned forming a contact hole to partially expose the source region. A trench is formed in the first insulating layer centered over the contact hole. The trench has vertical sidewalls and a horizontal bottom. A first conductive layer composed of polysilicon is then formed over the first insulating layer, at least completely filling the trench and filling the contact hole thereby forming an electrical contact with the source. In a key step, the first polysilicon layer is chemically mechanically polished to a depth that at least exposes the first insulation layer thereby forming a T shaped storage electrode. Next, a capacitor dielectric layer and a top electrode are sequentially formed over at least the T shaped storage electrode thereby forming a T shaped capacitor.

The second embodiment provides a method of fabricating a dynamic random access memory cell having a Y shaped storage capacitor on a substrate. An etch barrier layer is formed over the device area and elsewhere over the substrate. A first insulating layer composed of silicon oxide is formed the etch barrier layer. The first insulating layer is patterned forming a contact hole to partially expose the source region. A trench is formed in the first insulating layer centered around the contact hole. A conformal first conductive layer composed of polysilicon is formed over the first insulating layer, covering the sidewalls and bottom of the trench and the contact hole thereby forming an electrical contact with the source. The first conductive layer does not completely fill the trench. A dielectric layer is formed over the first conductive layer at least fills the trench. In an important step, the dielectric layer and the first conductive layer are chemically mechanically polished to a depth that at least exposes the first insulation layer thereby forming a Y shaped storage electrode. Next, a capacitor dielectric layer and a top electrode are formed over at least the Y shaped storage electrode thereby forming a Y shaped capacitor.

Both embodiments reduce the number of masking operations by using the chemically mechanically polishing process in place of a masking and etch steps. The first embodiment uses only two photo masks to form the T shaped capacitor. The second embodiment uses only two photo masks to form Y capacitor. Both embodiments use a chemical mechanical polishing process to eliminate polysilicon etch steps thereby eliminating stringer problems. Also, the capacitor is defined by the contact hole and therefore allows tighter ground rules and denser circuitry. Also, both embodiments increase the capacitor capacitance.

BRIEF DESCRIPTION OF THE DRAWINGS

The drawings show the following:

FIG. 4 is taken along axis 4/4' in FIG. 5 A.

Detailed Description of the Preferred Embodiment

Figure 6:
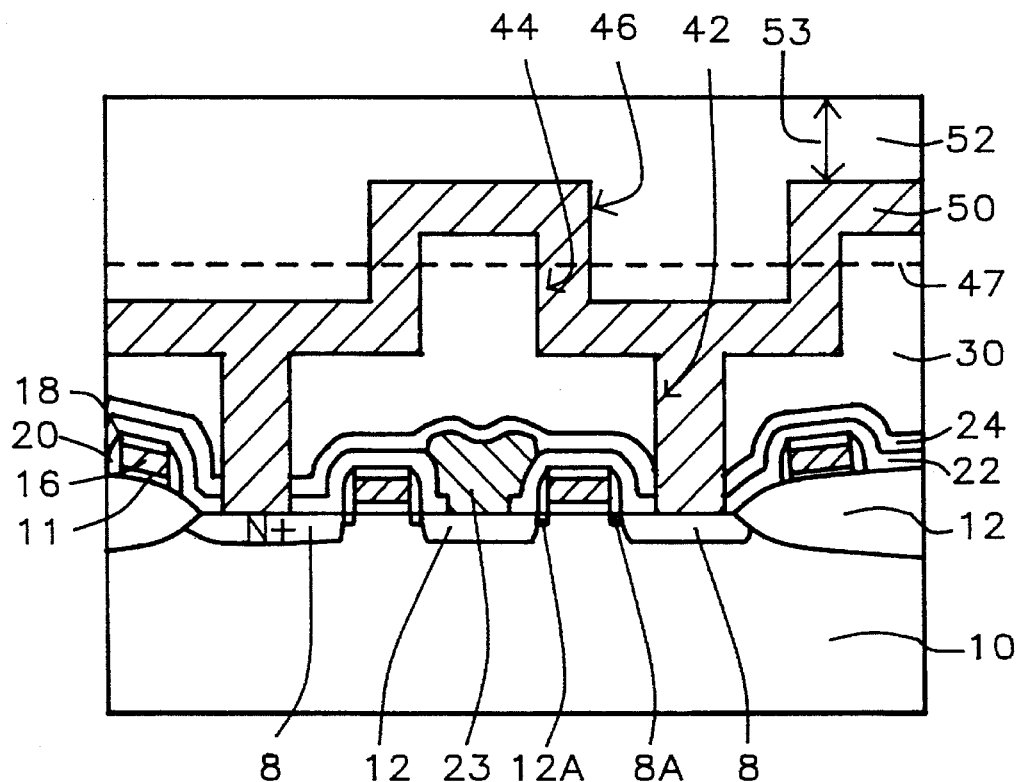
FIGS. 6 through 8 are cross sectional views for illustrating a second embodiment of the method for manufacturing a DRAM having a Y shaped capacitor according to the present invention.
Figure 7:
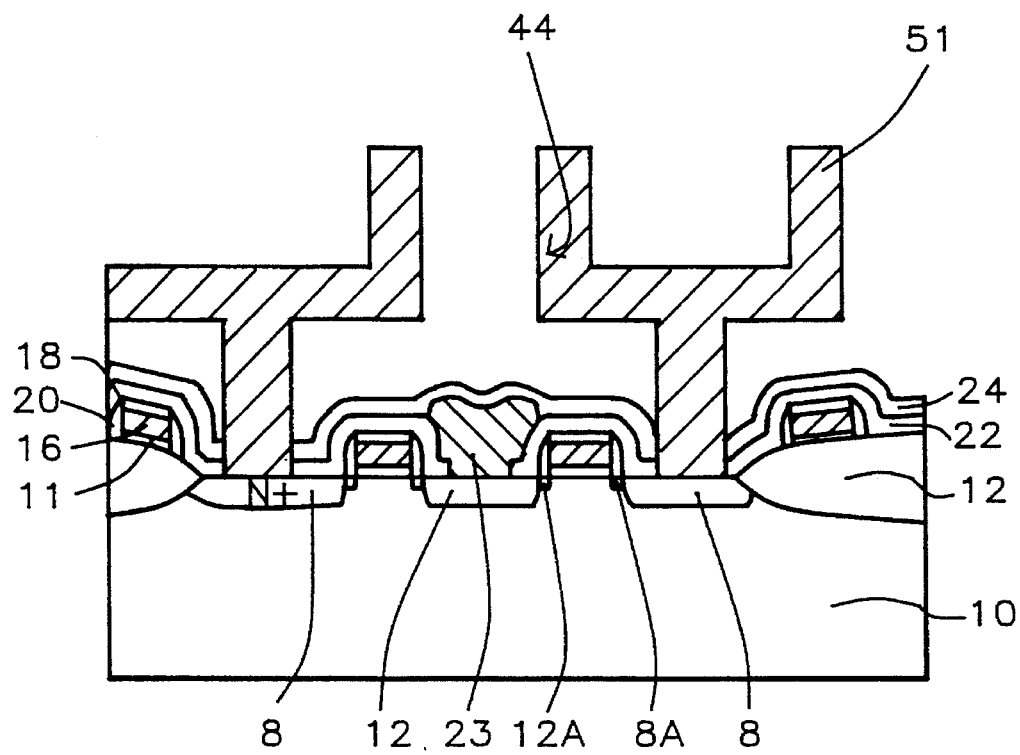
Figure 8:
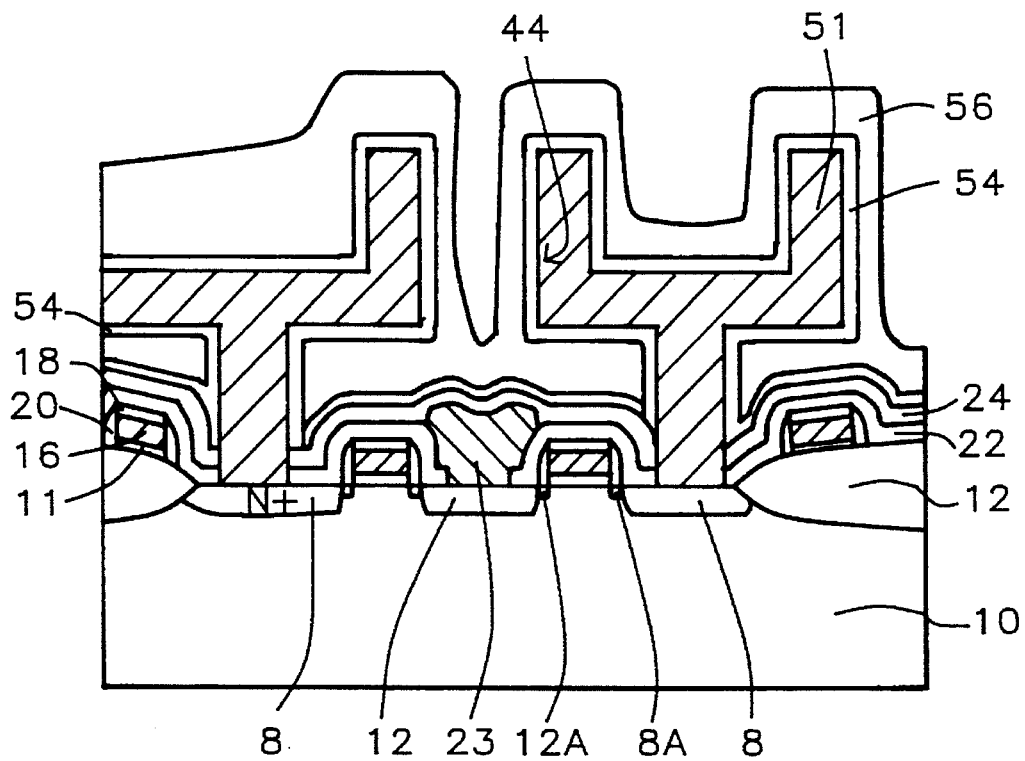

The present invention will be described in detail with reference to the accompanying drawings. The present invention provides a method of forming a DRAM having a T or Y shaped capacitor which has small dimensions, high capacitance, and is simple to manufacture. There are two embodiments of the present method. FIGS. 1 through 4 show the first embodiment where the storage electrode 50 has a T shape. See FIG. 4. FIGS. 6 through 8 show a second embodiment where storage capacitor has a Y shape. The process for forming the field oxide (FOX) and the field effect transistor structure as presently practiced in manufacturing DRAM cells are only briefly described in order to better understand the current invention. After that, the first and second embodiments of the method to fabricate the T and Y shaped capacitors will be described in detail.

Figure 1:
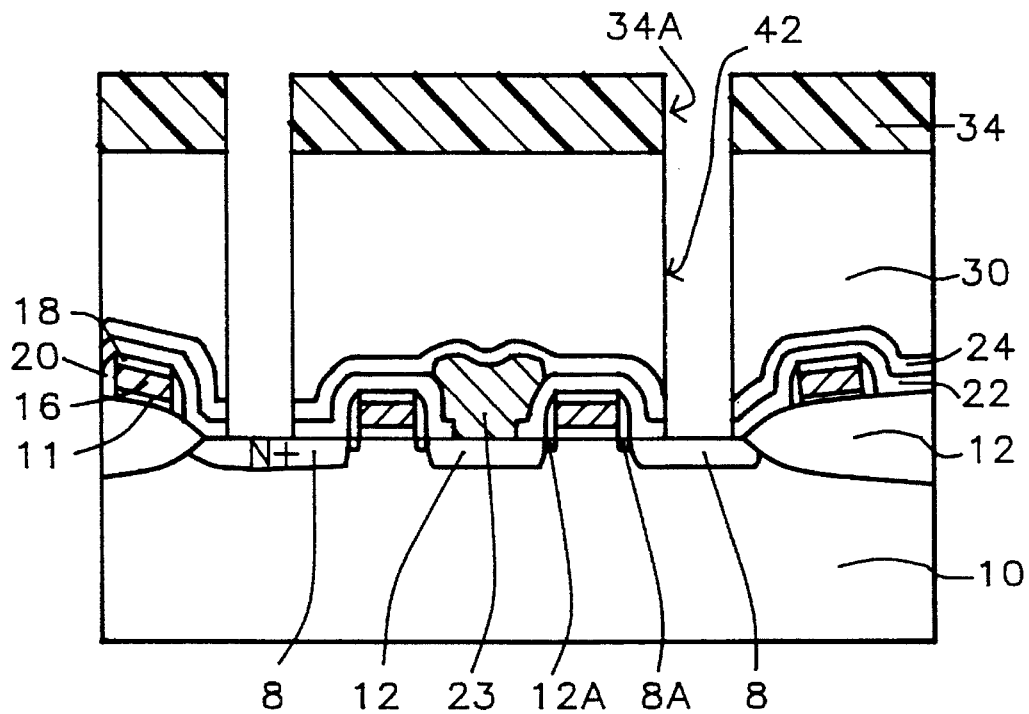
FIGS. 1 through 4 are cross sectional views for illustrating a first embodiment of the method for manufacturing a DRAM having a T shaped capacitor according to the present invention.

As shown in FIG. 1, the method of fabricating a capacitor begins by forming a field oxide layer 12 and FET devices on a substrate 10. Field oxide layer 12 is formed on a semiconductor substrate 10 for defining active regions and isolation regions. The preferred substrate is composed of a P-type single crystal silicon having a (100) crystallographic orientation. A relatively thick field oxide (FOX) 12 is formed around the active device areas to electrically isolate these areas. One method of forming these regions is describe by E. Kooi in U.S. Pat. No. 3,970,486, wherein selected surface portions of a silicon substrate are masked against oxidation and the unmasked surface is oxidized to grow a thermal oxide which in effect sinks into the silicon surface at the unmasked areas. The mask is removed and semiconductor devices can be formed in the openings between the isolation regions. The preferred thickness of the field oxide is preferably in the range between about 3000 and 7000 Å. The term "substrate" is meant to include devices formed on and within. The term substrate surface is meant to include the upper most surface of the substrate as well as the uppermost surface of layers formed on the substrate.

An optional channel stop implant (not shown) can be formed either before or after FOX 12 formation by ion implanting boron at a concentration of between about 2E12 and 5E13 atoms/cm$^2$ and at an energy between about 120 and 180 KeV.

The semiconductor field effect transistor (FET) MOS device is then formed in the active device area as shown in FIG. 1. The most commonly used device for dynamic random access memory (DRAM) is MOSFET. A gate oxide layer 11 is formed, typically by thermal oxidation of the silicon substrate, with a thickness between about 80 and 160 Å. An appropriately doped polysilicon layer and an insulating layer are deposited on substrate 10 and conventional photolithographic techniques are used to pattern these layers to form the gate electrodes 11 16 18. As shown in FIG. 1, the gates are formed on the substrate disposed between the field oxide regions 12 and over the field oxide regions. The gate on the substrate forms the gate electrode of the MOSFET in the active device areas. The gate electrodes formed over the field oxide 12 form word lines that electrically connect the MOSFET gate electrode to the appropriate peripheral circuits on the DRAM chip. The lightly doped source and drain 8A 12A of the N-channel MOSFET is formed next, usually by implanting an N-type atomic species, such as arsenic or phosphorus, through the spaces between the gate electrodes 16 18. A typical implant might consist of phosphorus P31 at a dose of between about 1E13 and 1E14 atoms/cm$^2$ and a typical energy is between about 30 and 80 Kev.

After forming the lightly doped source/drains 8A 12A, sidewall spacers 20 are formed on the gate electrode 11 16 18 sidewalls. These sidewall spacers 20 are preferably formed by depositing a low temperature silicon oxide and anisotropically etching back to the silicon surface. For example, the silicon oxide could be formed by a chemical vapor deposition using tetraethoxysilane (TEOS) at a temperature in the range of about 650° to 900° C. and the etch back preferably performed in a low pressure reactive ion etcher with a fluorine gas, such as $C_2F_6$ (carbon hexafluoride) or $CF_4+H_2$ (carbon tetrafluoride and hydrogen).

The source 8/drain 12 regions of the MOSFET are now implanted between the spacers with a N type atomic species, for example, arsenic (As75), to complete the source/drain (i.e., the source is the node contact) 8 12. The implantation is usually done through a thin layer of silicon oxide of about 200 to 300 Å fit in thickness to minimize implant channeling and to protect against contamination by metals and other impurities. A typical implantation dose is between 2E15 to 1E16 atoms/cm$^2$ and an energy of between about 20 to 70 Kev.

As shown in FIG. 1, a first conformal insulation layer 22 is formed over the substrate surface and over the source and drain areas 8 12. The conformal insulating layer 22 preferably formed of silicon nitride and undoped silicon oxide. The conformal insulating layer 22 is more preferably composed of a silicon oxide. Layer 22 preferably has a thickness in the range between about 500 and 3000 Å and more preferably about 1500 Å.

A bit line 23 is then formed by opening up a bit line contact opening to the drain 12 and by patterning a conductive layer. See FIG. 1. The bit line contact opening can be formed by conventional photo/etch processes. A conductive layer is formed over the substrate surface and in the bit line contact hole. The bit line 23 is preferably formed of a layer of tungsten silicide and a layer of doped polysilicon. The tungsten silicide layer preferably has a thickness in the range of between about 500 and 2500 Å. The polysilicon layer preferably has a thickness in the range of between about 500 and 2000 Å.

As shown in FIG. 1, an etch barrier layer 24 is formed over the bit line 23 and the first conformal layer 22. The etch barrier layer 24 is preferably formed of silicon nitride. Layer 24 preferably has a thickness in the range between about 500 and 3000 Å and more preferably about 1500 Å. The etch barrier layer has different etch characteristics than the first insulating layer 30 described below.

Still referring to FIG. 1, a first insulating layer 30 is formed over the etch barrier layer 24. The first insulating layer 30 is preferably formed of: P-doped silicon oxide (phosphosilicate glass), boron-doped silicon oxide, borophosphosilicate glass (BPSG), silicon oxide. A silicon oxide layer is preferably formed by using tetraethylorthosilicate (TEOS) in a low pressure chemical vapor deposition reactor. Also, a borophosphosilicate glass layer can be formed using Tetraethylorthosilicate (BPTEOS). The first insulating layer 30 is more preferably formed of borophosphosilicate glass (BPSG). The first insulating layer 30 preferably has a thickness in the range of between about 5000 and 15,000 Å and more preferably about 10,000 Å. The thickness of layer 30 partially determines the height of the storage electrode, which effects the cell's capacitance.

The remainder of this description relates more specifically to those objects of the invention, which relate to the formation of the T shaped storage capacitor having a smaller size, an increased capacitance, while providing a more manufacturable process. The first embodiment is described next and is shown in FIGS. 1 through 4.

Next, a contact hole 42 to the source 08 is formed through the first insulation layer 30 and the underlying layers. The contact hole 42 is formed using conventional lithography—etching techniques. As shown in FIG. 1, a first resist layer 34 having a contact opening 34A is formed over the first insulating layer 30. The first insulating layer 30 is anisotropically etched using the resist layer 34 as a mask. The contact hole 42 preferably has a circular shape with a diameter in the range of between about 0.35 and 0.7 μm and more preferably about 0.5 μm.

Figure 2:
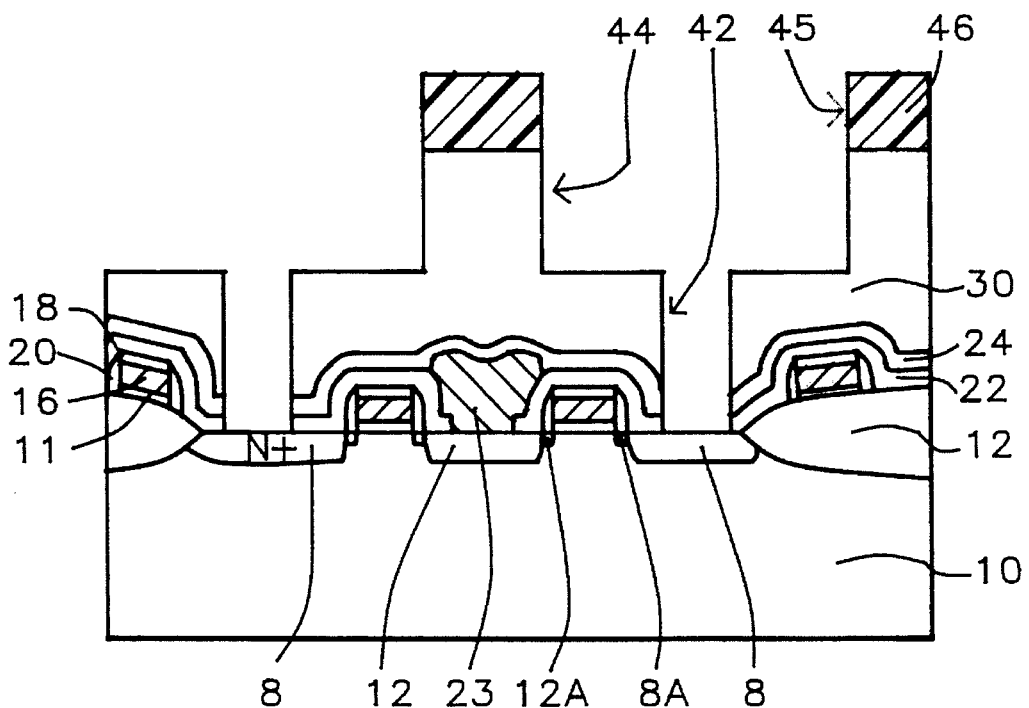

Referring to FIG. 2, an annular trench 44 is formed centered over the contact hole 44. The trench 44 is formed by removing an upper portion of the first insulation layer centered around the contact hole. The trench 44 preferably has substantially vertical sidewalls and a horizontal bottom. The trench can be made by forming a first photoresist layer 46 having a first opening 45 over the source region 8. The first opening 45 defines the area for the formation of the cylindrical storage electrode. Next, the first insulating layer 30 is anisotropically etched through the first opening 45 removing an upper portion of the first insulating layer. The trench 44 preferably has a circular, rectangular or square shape. The trench 44 is more preferably rectangular shaped with a length in the range of between about 0.8 and 1.2 μm and a width in the range of between about 0.4 and 0.8 μm. The trench preferably has a depth in the range of between about 2000 and 6000 Å. The photo resist layer 46 is then removed.

Figure 3:
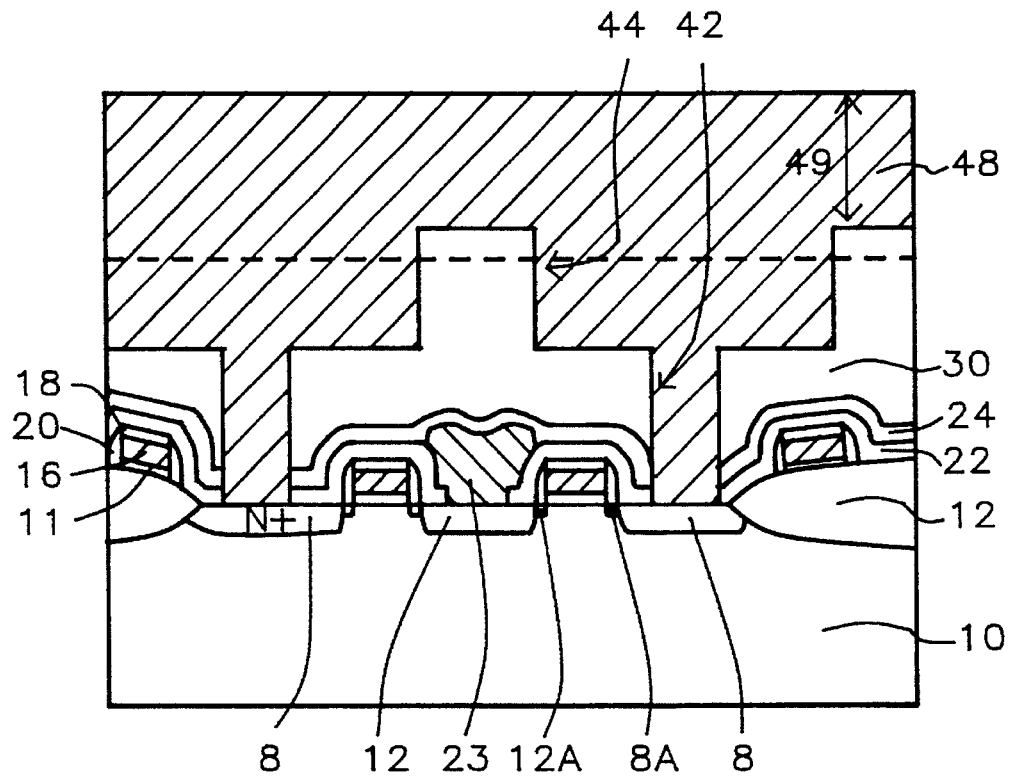

As shown in FIG. 3, a first conductive layer 48 is formed over the first insulating layer, at least completely filling the trench 44 and filling the contact hole 42 thereby forming an electrical contact with the source 8. The first conductive layer 48 is preferably formed of polysilicon doped with an impurity, such as phosphorus or arsenic; and preferably has an impurity concentration in the range of between about 1E19 and 1E21 atoms/cm$^3$ and more preferably 1E20 atoms/cm$^3$. The first conductive layer, over the first insulation layer 30, preferably has a thickness 48 in the range of between about 3000 and 5000 Å and more preferably about 3500 Å. The first conductive layer of polysilicon can be deposited by LPCVD (low pressure chemical vapor deposition). This layer is doped by ion implanting with phosphorous or arsenic ions at a dosage between about 5E15 and 2E16 atoms/sq-cm and at an energy of between about 20 and 60 Kev., or is doped with phosphorus oxychloride (POCl$_3$) at a temperature of between about 875 and 900° C., for between about 30 and 50 minutes. Alternately, the polysilicon layer may be doped in-situ.

In an important step, the first polysilicon layer 48 is chemical- mechanical polished (CMP) to a depth that at least exposes the first insulation layer thereby forming a T shaped storage electrode 50 (e.g., line 47). The material above the dotted line 47 in FIG. 3 is an example of the amount of first polysilicon layer 48 and first insulating layer 30 the CMP process removes. The wafer is subjected to a chemical mechanical polishing technique which is conducted to at least the point of exposing the upper surface of layer 30. The CMP process uses a slurry to polish the uppermost layers of the substrate. A typical slurry is the SCI slurry, available from Roden Products Corporation of Newark, Del. USA. Such slurry comprises KOH, SiO$_2$ particles and water. A typical CMP polish time would be from about 1 to 2 minutes. Any residual slurry left on the wafer surface would be removed by a conventional wet cleaning technique. The CMP process is superior to an etch back process because an etch back process can form sharp corners in the polysilicon layer around the trench wall. For example, the polysilicon in the trench often forms sharp high points at the joint between the polysilicon and first insulation layer. The sharp corners can cause integrity problems with an overlying capacitor dielectric layer 54.

Next, a selective wet etch is used to remove the first insulating layer 30. The etch barrier layer 24 (e.g., silicon nitride) protects the underlying structures as shown in figure Turning to FIG. 4, a capacitor dielectric layer 54 is formed over the storage electrode 50. The material of the dielectric layer 54 can be any suitable materiel having a high dielectric constant and being continuous and pinhole free. The conformal dielectric layer 54 can be formed of silicon nitride, an oxide/nitride/oxide (ONO) film, tantalum pentoxide ($Ta_2O_5$), oxide/nitride (ON), and silicon oxide material. Preferably, the conformal dielectric layer is formed of ONO. The conformal dielectric layer 54 preferably has at thickness in the range between about 40 to 150 Å and more preferably about 60 Å.

Figure 4:
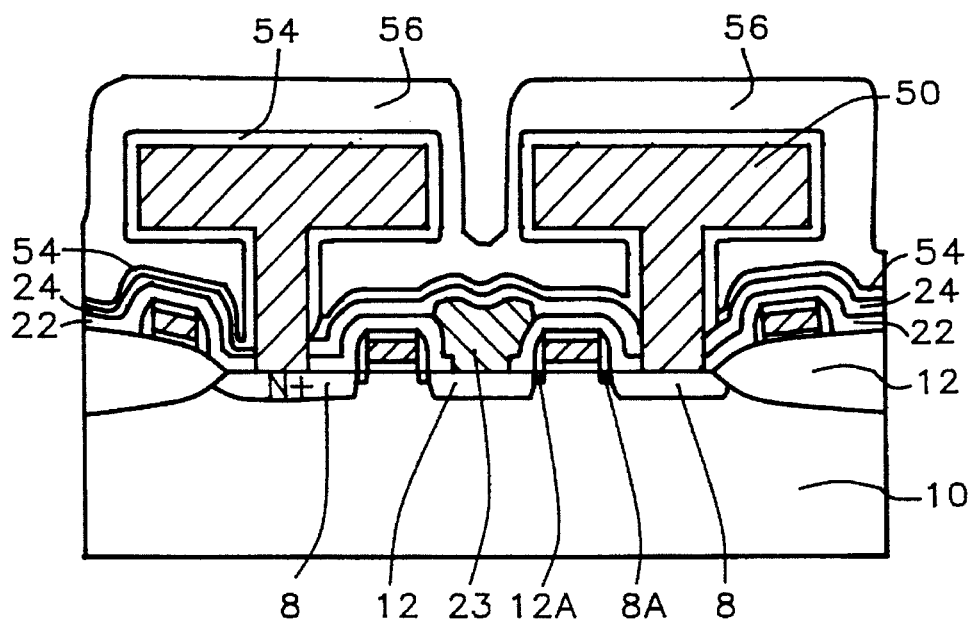

A top electrode 56 is formed over the capacitor dielectric layer as shown in FIG. 4. This is accomplished by forming a conductive layer over the capacitor dielectric layer and the resultant surface. The top electrode 56 preferably has a thickness in the range between about 1500 and 4000 Å and more preferably about 3000 Å. The top plate electrode is preferably formed with polycrystalline silicon in-situ doped with an impurity. The top plate electrode preferably has an impurity concentration in the range of between about 1E 19 and 1E21 atoms/$cm^3$ and more preferably about 1E20 atoms/$cm^3$.

Figure 5A:
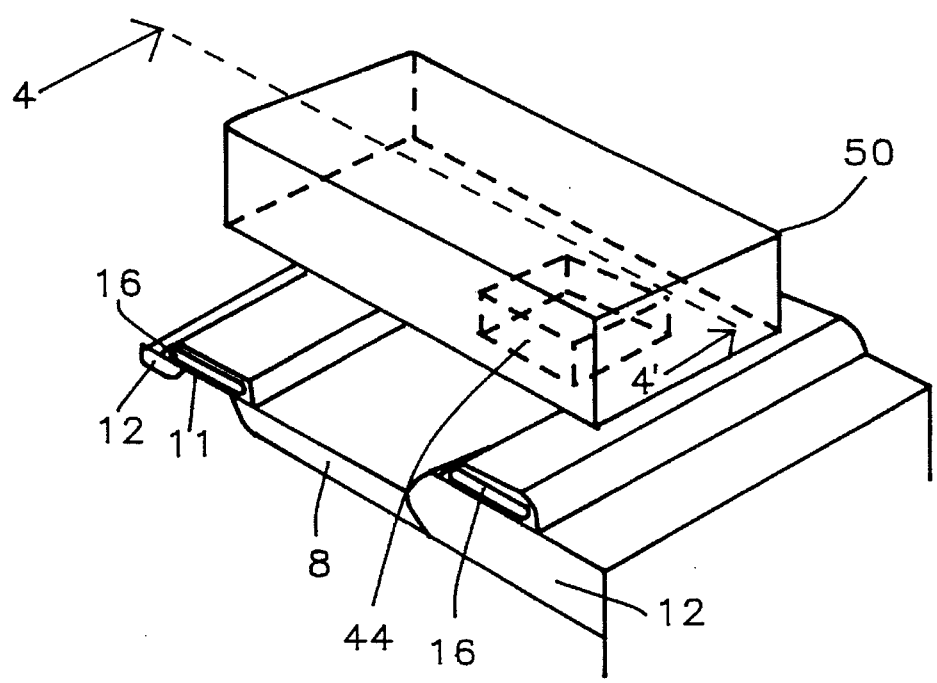
FIG. 5A is a three dimensional representation of the first embodiment of the method for manufacturing a DRAM having a T shaped capacitor according to the present invention. Cross sectional

FIG. 5A shows a schematic of a three dimensional view of the T shaped electrode of the present invention at the stage of fabrication after the T shaped storage electrode has been formed, but before the capacitor dielectric layer 54 and top electrode 56 have been formed.

Figure 5B:
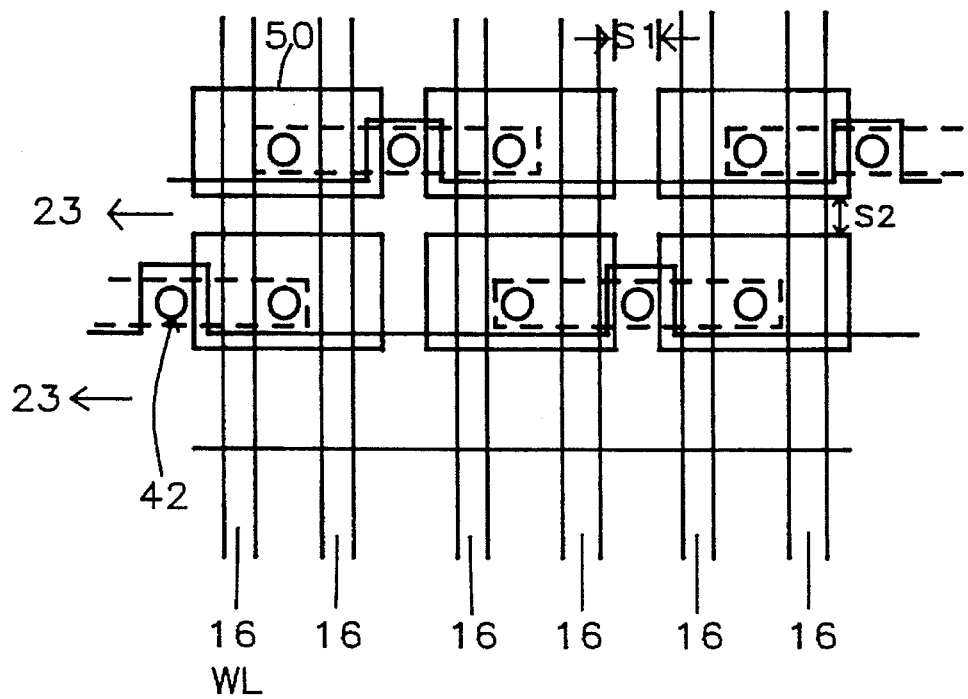
FIG. 5B is a schematic top plan view of the first embodiment of the method for manufacturing a DRAM having a T shaped capacitor according to the present invention.

FIG. 5B shows a top down view of the cylindrical T shaped capacitor of the present invention. The capacitor can have other shapes, such as rectangular, square, triangular, depending upon the application as is obvious to one skilled in the art. The spacings $S_1$ and $S_2$ between adjacent storage electrodes (e.g., trench spacing) are smaller than spacing that the conventional "block spacing". See FIG. 5B. Also, the chemical mechanical polishing processing allows smaller storage capacitor to be formed without forming the sharp points in the storage electrode that pierce the capacitor dielectric layer.

The second embodiment of the method is described below and is shown in FIGS. 6 through 9. The second embodiment provides a method of fabricating dynamic random access memory cell having a T shaped storage capacitor on a substrate. As shown in FIG. 6, a silicon substrate 10 is prepared using the process steps of forming the trench 44 defining the storage electrode as describe above in the first embodiment. See FIGS. 1 and 2. At this point, fabrication of word lines, associated active area and optional digit lines for a capacitor over digit line have been completed.

Referring to FIG. 6, a conformal first conductive layer 50 is formed over the first insulating layer 30, over the sidewalls 44 and bottom of the trench 44 and fills the contact hole 42 thereby forming an electrical contact with the source 08. The first conductive layer does not completely fill the trench 44 and forms a second trench 46 following the contours of the trench 44 in the first insulation layer 30.

The first conductive layer 50 is preferably formed of polysilicon. The first conductive layer 50 is more preferably formed of doped polysilicon preferably having a thickness in the range of between about 2500 and 3000 Å and more preferably about 2700 Å. The first conductive layer is preferably formed of a polysilicon doped with an impurity selected from the group consisting of: phosphorus and arsenic, and preferably has an impurity concentration in the range of between about 1E19 and 1E20 atoms/$cm^3$.

Still referring to FIG. 6, a dielectric layer 52 is formed over the first conductive layer 50 at least filling the trench 46. The dielectric layer 52 is preferably formed of borophosphosilicate glass (BPSG, BPTEOS) and silicon oxide. The dielectric layer preferably has a thickness 53 (see FIG. 6) over the first insulating layer 30 in the range of between about 4000 and 10,000 Å and more preferably about 7000 Å.

Next, the dielectric layer 52 and the first conductive layer 50 are chemically mechanically polished (CMP) to a depth that at least exposes the first insulation layer 30 thereby forming a Y shaped storage electrode 50. See FIG. 6. The dashed line 47 on FIG. 6 is an example of the depth the layers are chemically mechanically polished down to. The conductive layer 50 between the active areas polished away thus electrically isolating adjacent storage electrodes 51. The chemically mechanically polishing process can be performed as described above.

As shown in FIG. 7, a selective etch is preferably used to remove the first insulating layer 30. The etch barrier layer 24 (e.g., silicon nitride) protects the underlying structures. The selective etch can be a buffered HF etch.

Turning to FIG. 8, a capacitor dielectric layer 54 is formed over the storage electrode 51. The material of the dielectric layer 54 can be any suitable materiel having a high dielectric constant and being continuous and pinhole free. The conformal dielectric layer 54 can be formed of silicon nitride, an oxide/nitride/oxide (ONO) film, tantalum pentoxide ($Ta_2O_5$), oxide/nitride (ON), and silicon oxide material. Preferably, the conformal dielectric layer is formed of ONO. The conformal dielectric layer 54 preferably has at thickness in the range between about 40 to 150 Å and more preferably about 60 Å.

A top electrode 56 is formed over the capacitor dielectric layer as shown in FIG. 8. This is accomplished by forming a conductive layer over the resultant surface. The top electrode 56 has a thickness in the range between about 1500 and 4000 Å and more preferably about 3000 Å. The top plate electrode is preferably formed with polycrystalline silicon doped with an impurity. The top plate electrode preferably has an impurity concentration in the range of between about 1E19 and 1E21 atoms/$cm^3$ and more preferably about 1E20 atoms/$cm^3$.

Figure 9:
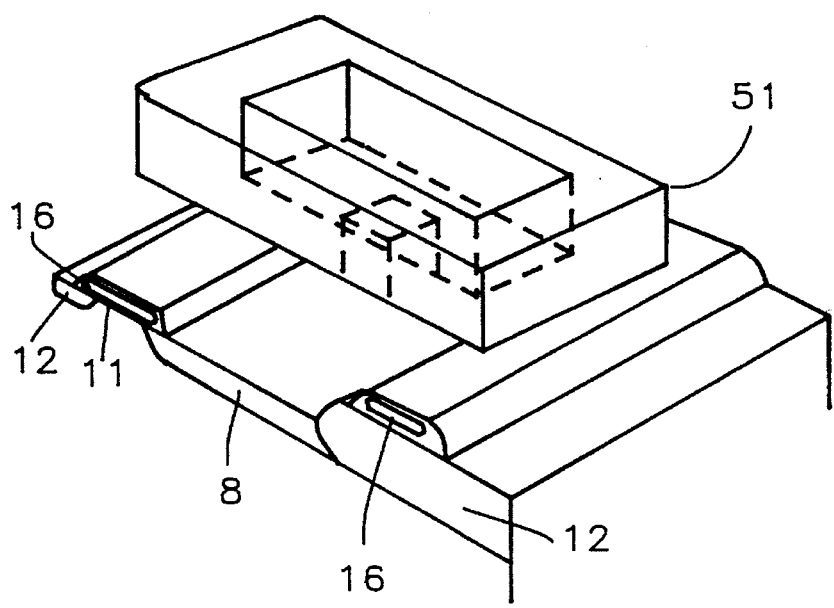
FIG. 9 is a three dimensional representation of the second embodiment of the method for manufacturing a DRAM having a Y shaped capacitor according to the present invention.

FIG. 9 shows a three dimensional view of the Y shaped electrode 51 of the present invention at the stage of fabrication after the Y shaped storage electrode 51 has been formed but before the capacitor dielectric and top electrode have been formed. The capacitor can have other shapes, such as rectangular, square, triangular, depending upon the application as is obvious to one skilled in the art.

Both embodiments of the present invention reduce the number of masking operations by using the chemically mechanically polishing process in place of masking and etch steps. The first embodiment uses only two photo masks to form the T shaped capacitor. The second embodiment uses only two photo masks to form the Y capacitor. Both embodiments use a chemical mechanical polishing process to eliminate a poly etch step thereby eliminating stringer problems. Also, the spacing between the bottom electrodes 50, 51 (e.g., S1 and S2, FIG. 5B) is smaller than conventional bottom electrode spacing because the invention's bottom electrode spacing is defined by the spacing between the trenches 44 (i.e. photoresist line 46 width, FIG. 2). A property of photolithography is that line widths can be formed narrower than openings widths. For the invention, the spacing between the trenches 44 is defined by minimum photoresist line 46 width. In contrast, conventional bottom electrode spacings are defined by the wider photoresist opening widths. Therefore, the current invention provides smaller spacing between bottom electrodes, tighter ground rules, and denser circuitry.

It should be will understood by one skilled in the art that by including additional process steps not described in this embodiment, other types of devices can also be included on the DRAM chip. For example, P wells in the P substrate and CMOS circuit can be formed therefrom. It should also be understood that the figures depict only one DRAM storage cell out of a multitude of cells that are fabricated simultaneously on the substrate. Also, the capacitor can be used in other chip types in addition to DRAM chips.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a capacitor having a T shaped storage electrode for a memory device on a substrate; said substrate having a device area with a source region formed therein, comprising the steps of:

a) forming an etch barrier layer over at least said device area and elsewhere over said substrate;

b) forming a first insulating layer over said barrier layer;

c) patterning the first insulating layer forming a contact hole to at least partially expose said source region;

d) forming a trench in said first insulating layer centered around said contact hole; said trench having vertical sidewalls and a horizontal bottom;

e) forming a first conductive layer composed of polysilicon over the first insulating layer, at least completely filling said trench and filling said contact hole thereby forming an electrical contact with said source;

f) chemical-mechanical polishing said first polysilicon layer to a depth that at least exposes said first insulation layer thereby forming a T shaped storage electrode; removing said first insulating layer; and h) sequentially forming a capacitor dielectric layer and a top electrode over said at least said T shaped storage electrode thereby forming a T shaped capacitor.

2. The method of claim 1 said substrate further includes a first conformal layer composed of silicon oxide at least over said device area.

3. The method of claim 2 wherein said first conformal layer is composed of silicon oxide and has a thickness in the range of between about 500 and 3000 Å and said etch barrier layer is composed of silicon nitride having a thickness in the range of between about 500 and 3000 Å.

4. The method of claim 1 wherein said first insulating layer is composed of a material selected from the group consisting of: BPSG, and silicon oxide; and has a thickness in the range of between about 5000 and 15,000 Å.

5. The method of claim 1 wherein forming said trench comprises: forming a first photoresist layer having an first opening over said source region which defines the area for the formation of said T shaped storage electrode and anisotropically etching said first insulating layer through said first opening removing an upper portion of said first insulating layer.

6. The method of claim 1 wherein said trench has a depth in the range of between about 2000 and 6000 Å; and width in the range of between about 0.4 and 0.8 μm; and a length in the range of between about 0.8 and 1.2 μm.

7. The method of claim 1 wherein said first conductive layer is polysilicon doped with an impurity selected from the group consisting of: phosphorus and arsenic and has an impurity concentration in the range of between about 1E19 and 1E21 atoms/cm$^3$ and a thickness over said first insulating layer in the range of between about 3000 to 5000 Å.

8. The method of claim 1 wherein said capacitor dielectric layer is composed of a material selected from the group consisting of: a three layer structure of silicon oxide/silicon nitride/silicon oxide (ONO), a two layer structure of silicon oxide/silicon nitride (ON), and silicon nitride; said capacitor dielectric layer has a thickness in the range of between about 40 and 150 Å.

* * * * *